(12) United States Patent
Blomme et al.

(10) Patent No.: US 8,652,902 B2
(45) Date of Patent: Feb. 18, 2014

(54) FLOATING GATE SEMICONDUCTOR MEMORY DEVICE AND METHOD FOR PRODUCING SUCH A DEVICE

(75) Inventors: Pieter Blomme, Ostend (BE); Antonino Cacciato, Leuven (BE); Gouri Sankar Kar, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/410,843

(22) Filed: Mar. 2, 2012

(65) Prior Publication Data
US 2012/0223378 A1 Sep. 6, 2012

Related U.S. Application Data

(60) Provisional application No. 61/448,828, filed on Mar. 3, 2011.

(30) Foreign Application Priority Data

Jul. 6, 2011 (EP) .................................... 11075160

(51) Int. Cl.
*H01L 21/336* (2006.01)
(52) U.S. Cl.
USPC ........... 438/265; 438/257; 438/259; 438/593; 438/594; 438/595; 257/314; 257/315; 257/E21.422; 257/E21.553; 257/E21.561
(58) Field of Classification Search
USPC ......... 438/175, 211, 259, 265, 593, 594, 634, 438/738, FOR. 203, 257, 595, 770–774, 438/787–790; 257/314, 315, E21.32, 257/E21.422, E21.68, E21.681, E27.112, 257/E29.128, E29.129, E29.3, E21.545, 257/E21.546, E21.549, E21.552, E21.553, 257/E21.561
See application file for complete search history.

(56) References Cited

U.S. PATENT DOCUMENTS

| 5,387,540 A | * | 2/1995 | Poon et al. ..................... 438/430 |
| 5,436,488 A | * | 7/1995 | Poon et al. ..................... 257/397 |
| 5,956,600 A | * | 9/1999 | Kuroi et al. ..................... 438/446 |

(Continued)

FOREIGN PATENT DOCUMENTS

| EP | 0274390 A2 | 7/1988 |
| JP | 56-108271 | 8/1981 |

(Continued)

OTHER PUBLICATIONS

European Search Report, European Patent Application No. 11075160.9 dated Nov. 16, 2011.

*Primary Examiner* — Fernando L Toledo
*Assistant Examiner* — Christine C Lau
(74) *Attorney, Agent, or Firm* — McDonnell Boehnen Hulbert & Berghoff LLP

(57) ABSTRACT

Disclosed are methods for manufacturing a floating gate memory device and the floating gate memory device thus obtained. In one embodiment, a method is disclosed that includes providing a semiconductor-on-insulator substrate, forming at least two trenches in the semiconductor-on-insulator substrate, and, as a result of forming the at least two trenches, forming at least one elevated structure. The method further includes forming isolation regions at a bottom of the at least two trenches by partially filling the at least two trenches, thermally oxidizing sidewall surfaces of at least a top portion of the at least one elevated structure, thereby providing a gate dielectric layer on at least the exposed sidewall surfaces; and forming a conductive layer over the at least one elevated structure, the gate dielectric layer, and the isolation regions to form at least one floating gate semiconductor memory device.

12 Claims, 14 Drawing Sheets

(56) References Cited

U.S. PATENT DOCUMENTS

| | | | |
|---|---|---|---|
| 6,719,012 B2* | 4/2004 | Doan et al. | 438/428 |
| 6,734,063 B2* | 5/2004 | Willer et al. | 438/257 |
| 6,881,645 B2* | 4/2005 | Ahn et al. | 438/424 |
| 7,495,287 B2* | 2/2009 | Oka et al. | 257/347 |
| 7,947,589 B2* | 5/2011 | Muralidhar et al. | 438/585 |
| 8,456,908 B2* | 6/2013 | Ichikawa et al. | 365/185.05 |
| 2002/0076918 A1* | 6/2002 | Han et al. | 438/634 |
| 2002/0142546 A1* | 10/2002 | Kouznetsov et al. | 438/257 |
| 2003/0170964 A1* | 9/2003 | Kao et al. | 438/433 |
| 2005/0239265 A1* | 10/2005 | Doan et al. | 438/424 |
| 2006/0043456 A1* | 3/2006 | Derderian et al. | 257/314 |
| 2008/0121970 A1* | 5/2008 | Aritome | 257/316 |
| 2010/0248435 A1 | 9/2010 | Olsen et al. | |
| 2010/0270605 A1* | 10/2010 | Choi et al. | 257/316 |

FOREIGN PATENT DOCUMENTS

| | | |
|---|---|---|
| JP | 01-255271 | 10/1989 |
| JP | 1308079 | 12/1989 |
| JP | 08-125037 | 5/1996 |

* cited by examiner

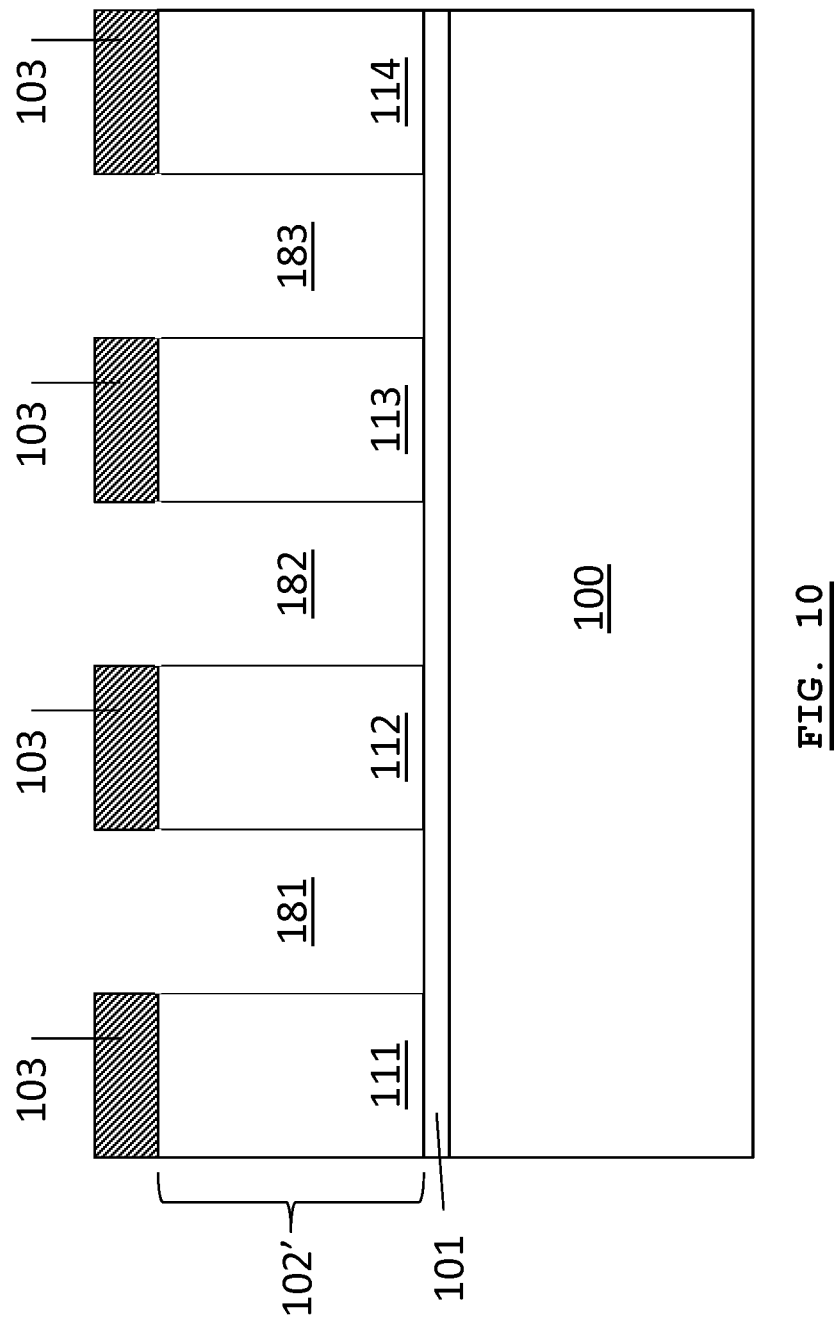

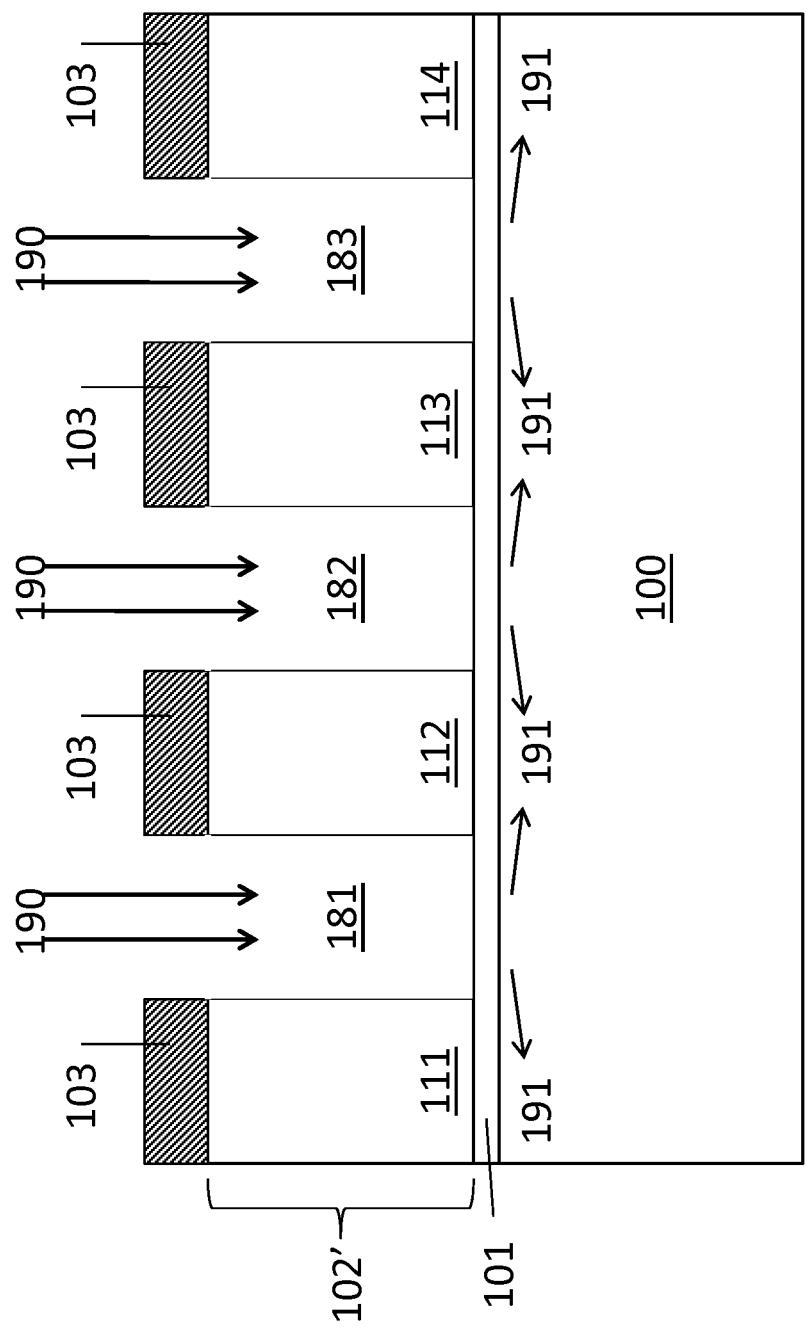

FLOATING GATE SEMICONDUCTOR MEMORY DEVICE AND METHOD FOR PRODUCING SUCH A DEVICE

CROSS-REFERENCE TO RELATED APPLICATIONS

This application is a non-provisional of U.S. Provisional Patent Application Ser. No. 61/448,828 filed Mar. 3, 2011, the contents of which are hereby incorporated by reference. This application also claims priority to European Patent Application Serial No. 11075160.9 filed Jul. 6, 2011, the contents of which are hereby incorporated by reference.

BACKGROUND

For NAND flash memory devices, both the physical scaling and the electrical scaling have become more challenging with each technology node.

In state-of-the-art NAND flash memory devices, the oxide-nitride-oxide (ONO) interpoly dielectric (IPD), which can more generally be referred to as the gate dielectric, runs along the sidewalls of the floating gate in order to provide a large capacitance between floating gate and control gate and, in turn, a large coupling ratio. As the IPD layer is present twice in one width defined by the pitch, scaling of the thickness of the IPD layer in a floating gate flash device becomes a limiting factor for flash scaling below a 2× generation technology node, which corresponds to a memory cell half-pitch between 20 nm and 29 nm inclusive. To achieve good data retention, the physical thickness of the IPD layer is limited to about 12 to 15 nm using state-of-the art materials, which corresponds to a minimum pitch size of about 24 to 30 nm, as it is still necessary to add the thickness of the floating gate and the control gate.

FIG. 1 shows a schematic representation of a typical floating gate memory device on a substrate 1, comprising floating gate structures 2, isolation areas 3, interpoly dielectric layer 4 wrapped around the floating gate structures 2, tunnel oxide layers 5 and a control gate 6. It is seen that the scaling of the pitch P of the floating gate memory device becomes a great challenge as it is necessary within the pitch P to have room for the floating gate structures (FGSs) 2, for an interpoly dielectric (IPD) layer 4, for a control gate (CG) 6 and for another interpoly dielectric (IPD) layer 4. With the materials currently used for the IPD layer (e.g., ONO or aluminum oxide-based (AlO-based) dielectric stack, the thickness of the IPD layer is limited to about 12 to 15 nm in order to achieve good data retention (e.g., about 10 years of data retention) for the floating gate memory device. When scaling to smaller thickness, the electrical properties of the materials currently used for the IPD layer are no longer sufficient, as the smaller thickness causes increased leakage and bad performance of the device.

SUMMARY

There is thus a need for floating gate memory devices with a good data retention and electrical performance, which are scalable below 3× generation technology node, and even scalable below 2× generation technology node.

Disclosed is a floating gate semiconductor device, such as a monocrystalline floating gate semiconductor device. Also disclosed are methods for manufacturing a floating gate semiconductor device, such as for manufacturing a monocrystalline floating gate semiconductor device.

In one aspect, a method of manufacturing a floating gate semiconductor memory device is disclosed. The method includes providing a semiconductor-on-insulator substrate comprising a semiconductor base layer, a dielectric layer on and in contact with the semiconductor base layer, and a monocrystalline semiconductor top layer on and in contact with the dielectric layer. The method further includes forming at least two trenches in the semiconductor-on-insulator substrate, where the at least two trenches extend through the top layer and the dielectric layer and extend partially through the base layer, and, as a result of forming the at least two trenches, forming at least one elevated structure comprising a base portion comprising a portion of the base layer, a dielectric portion comprising a portion of the dielectric layer, wherein the dielectric portion is on and in contact with the base portion, and a top portion comprising a portion of the top layer, where the top portion is on and in contact with the dielectric portion. The method still further includes forming isolation regions at a bottom of the at least two trenches, where forming the isolation regions comprises partially filling the at least two trenches, and thermally oxidizing sidewall surfaces of at least the top portion, thereby providing a gate dielectric layer on at least the exposed sidewall surfaces. The method still further includes forming a conductive layer over the at least one elevated structure, the gate dielectric layer, and the isolation regions to form at least one floating gate semiconductor memory device.

In some embodiments, the dielectric portion comprises a tunnel dielectric layer, the top portion comprises a floating gate, and the conductive layer comprises a control gate.

In some embodiments, partially filling the at least two trenches comprises filling the at least two trenches with an insulating material and partially removing the insulating material from the at least two trenches, leaving insulating material at the bottom of the at least two trenches, thereby forming the isolation regions.

In some embodiments, the dielectric layer has an equivalent oxide thickness between about 6 nm and about 10 nm.

In some embodiments, the method further includes thermally oxidizing a top surface of the at least one elevated structure, thereby providing the gate dielectric on the top surface of the at least one elevated structure.

In some embodiments, the isolation regions are in contact with the base portion and the dielectric portion of the at least one elevated structure, and with a portion of the gate dielectric layer and the isolation regions extend above the dielectric portion.

In some embodiments, forming the at least two trenches comprises forming a patterned hardmask layer on the semiconductor-on-insulator substrate and etching the at least two trenches in areas of the semiconductor-on-insulator substrate that are not patterned with the patterned hardmask layer. Further, in these embodiments, after the at least two trenches are formed, the patterned hardmask layer may remain on a top surface of the at least one elevated structure and the conductive layer may be formed over the patterned hardmask layer that remains on the top surface of the at least one elevated structure. Alternatively, in these embodiments, the patterned hard mask layer may be removed after forming the at least two trenches, and, after removing the patterned hardmask layer and before thermally oxidizing the sidewall surfaces of the top portion, top corners of the at least one elevated structure may be rounded.

In some embodiments, forming the at least two trenches comprises, in a first etch, etching through the top layer to expose the dielectric layer, thereby forming at least two partial trenches and, in a second etch, etching through the dielectric layer and partially through the base layer, thereby converting the at least two partial trenches to the at least two trenches.

In some embodiments, the method further includes, after the first etch and before the second etch, injecting dopant elements into the at least two partial trenches.

In some embodiments, the gate dielectric layer has a thickness between about 6 nm and about 8 nm.

In another aspect, a floating gate semiconductor memory device is disclosed. The floating gate semiconductor memory device includes a semiconductor-on-insulator substrate comprising a semiconductor base layer, a dielectric layer on and in contact with the semiconductor base layer, and a monocrystalline semiconductor top layer on and in contact with the dielectric layer. The floating gate semiconductor memory device further includes at least two trenches formed in the semiconductor-on-insulator substrate, where the at least two trenches extend through the top layer and the dielectric layer and extend partially through the base layer. The floating gate semiconductor memory device still further includes at least one elevated structure between the at least two trenches, the at least one elevated structure comprising a base portion comprising a portion of the base layer, a dielectric portion comprising a portion of the dielectric layer, wherein the dielectric portion is on and in contact with the base portion, and a top portion comprising a portion of the top layer, where the top portion is on and in contact with the dielectric portion. The floating gate semiconductor memory device still further includes isolation regions at a bottom of the at least two trenches, where the isolation regions partially fill the at least two trenches, a gate dielectric layer on at least exposed sidewall surfaces the top portion, and a conductive layer over the at least one elevated structure, the gate dielectric layer, and the isolation regions. The dielectric portion comprises a tunnel dielectric layer, the top portion comprises a floating gate, and the conductive layer comprises a control gate.

In some embodiments, the dielectric layer has an equivalent oxide thickness between about 6 nm and about 10 nm.

In some embodiments, the isolation regions are in contact with the base portion and the dielectric portion of the at least one elevated structure, and with a portion of the gate dielectric layer, and the isolation regions extend above the dielectric portion. In these embodiments, the isolation regions may extend between about 5 nm and about 20 nm above the dielectric portion.

In some embodiments, the at least two partial trenches comprise dopant elements.

In some embodiments, the gate dielectric layer has a thickness between about 6 nm and about 8 nm.

In some embodiments, top corners of the at least one elevated structure are rounded. In these embodiments, the top corners may have a radius of at least 2 nm.

In some embodiments, the floating gate semiconductor memory device further includes a patterned hardmask layer between a top surface of the at least one elevated structure and the conductive layer.

The disclosed methods and devices may allow for the scaling of a floating gate semiconductor memory device down to the 1× generation technology node. Further, the disclosed methods and devices may allow for a floating gate semiconductor memory device with a gate dielectric layer that has a thickness less than 12 nm. Still further, the disclosed methods and devices may allow for a floating gate semiconductor memory device with 10 year data retention. Still further, the disclosed methods and devices may allow for a floating gate semiconductor memory that is manufactured with a simplified and lower cost manufacturing process.

BRIEF DESCRIPTION OF THE DRAWINGS

FIGS. 2 to 11 illustrate example embodiments of methods for manufacturing a floating gate semiconductor device, in accordance with some embodiments.

Figure 1:
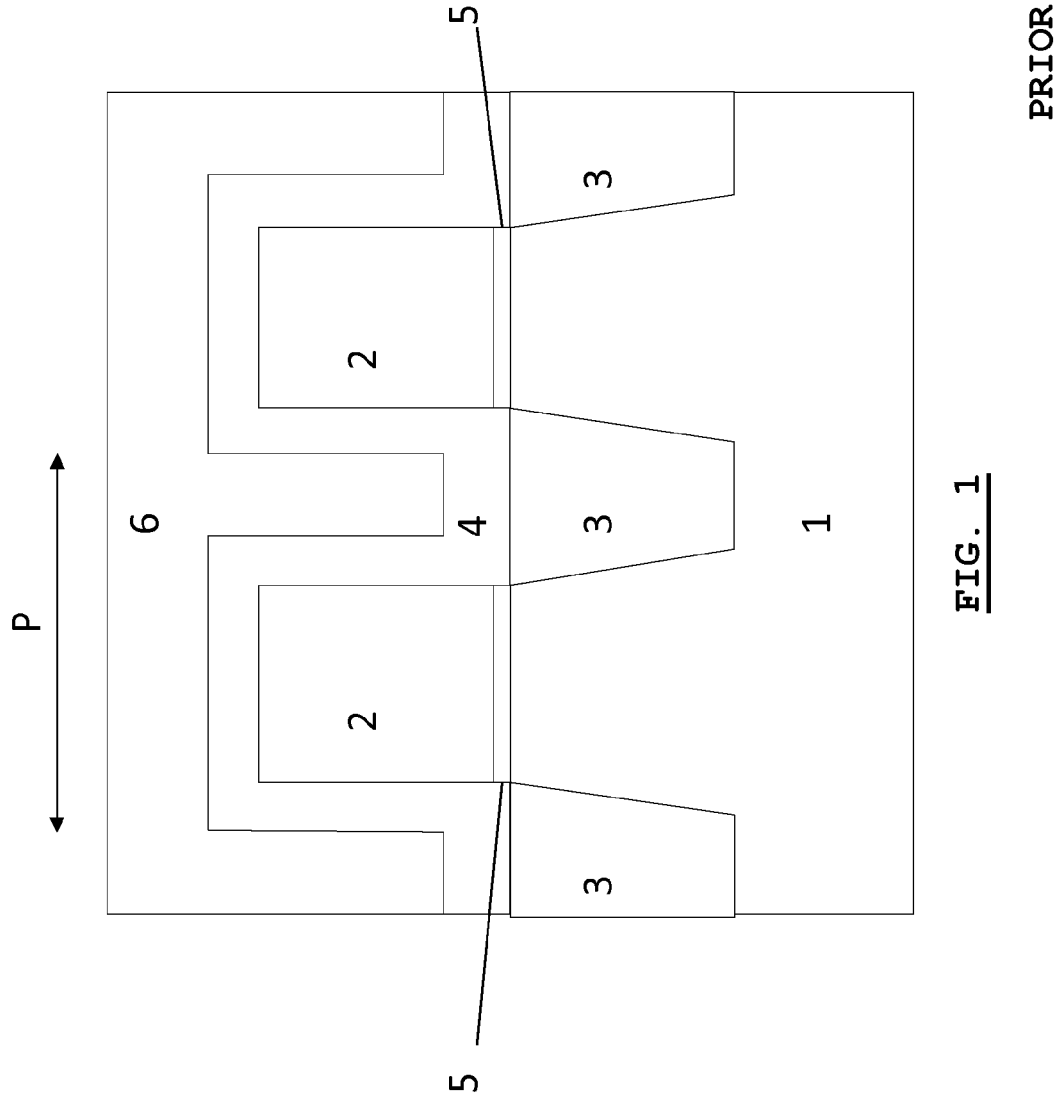
FIG. 1 is a schematic representation of a typical non-volatile floating gate semiconductor memory device art.

Any reference signs in the claims shall not be construed as limiting the scope.

In the different drawings, the same reference signs typically refer to the same or analogous elements, except where otherwise noted.

DETAILED DESCRIPTION

One or more embodiments will now be described in detail with reference to the attached figures, while the invention is not limited thereto. The drawings described are only schematic and are non-limiting. In the drawings, the size of some of the elements may be exaggerated and not drawn on scale for illustrative purposes. Those skilled in the art can recognize numerous variations and modifications of this invention that are encompassed by its scope. Accordingly, the following description of certain inventive embodiments should not be deemed to limit the scope of the present invention.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features sometimes grouped together in a single embodiment, figure, or description thereof for the purpose of streamlining the disclosure and aiding in the understanding of one or more of the various features. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as encompassing one or more separate embodiments of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

FIGS. 2 to 11 illustrate example embodiments of methods for manufacturing a floating gate semiconductor device, in accordance with some embodiments.

Figure 2:
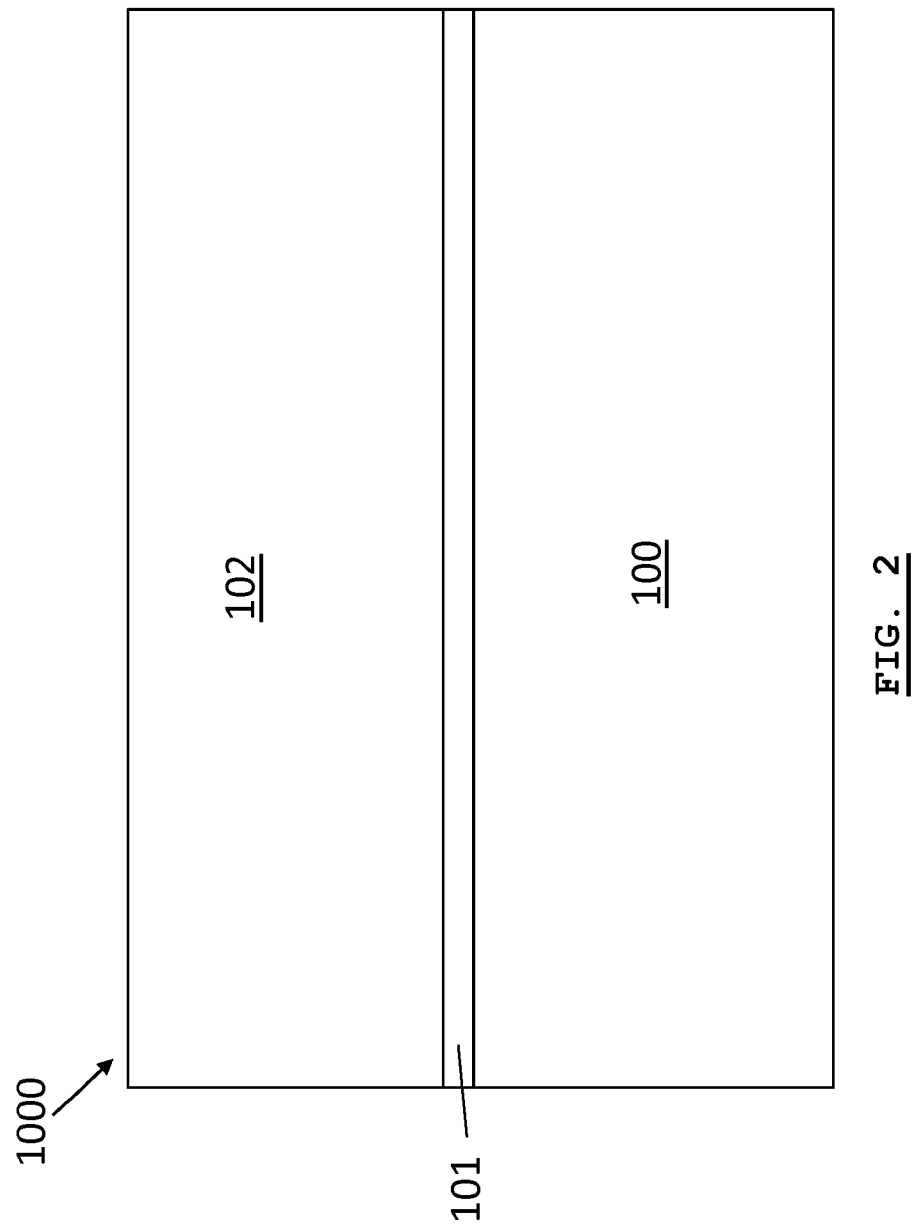

In the embodiment shown in FIG. 2, the starting material is a semiconductor-on-insulator substrate 1000. The semiconductor-on-insulator substrate comprises an insulating layer 101, which is a dielectric layer sandwiched in between a semiconductor base layer 100 and a semiconductor top layer 102. The semiconductor top layer 102 comprises or consists of a monocrystalline semiconducting material. For example, the semiconductor-on-insulator substrate 1000 may be an SOI substrate, such as a monocrystalline silicon (Si) top layer 102 on and in contact with a buried silicon oxide layer 101 (known as 'box' layer), the buried silicon oxide layer on and in contact with a silicon base layer 100.

The dielectric layer 101 may be an ultra-thin layer, meaning the equivalent oxide thickness of the dielectric layer 101 may be smaller than 10 nm, or between 6 nm and 10 nm.

At least two trenches 121, 122, 123 may be formed in the semiconductor-on-insulator substrate 100. Forming the at least two trenches 121-123 (and thus the elevated structures 111-114) may be done using conventional techniques known for a person skilled in the art, for example, by using lithographic techniques, as explained further in connection with FIG. 3.

Figure 3:
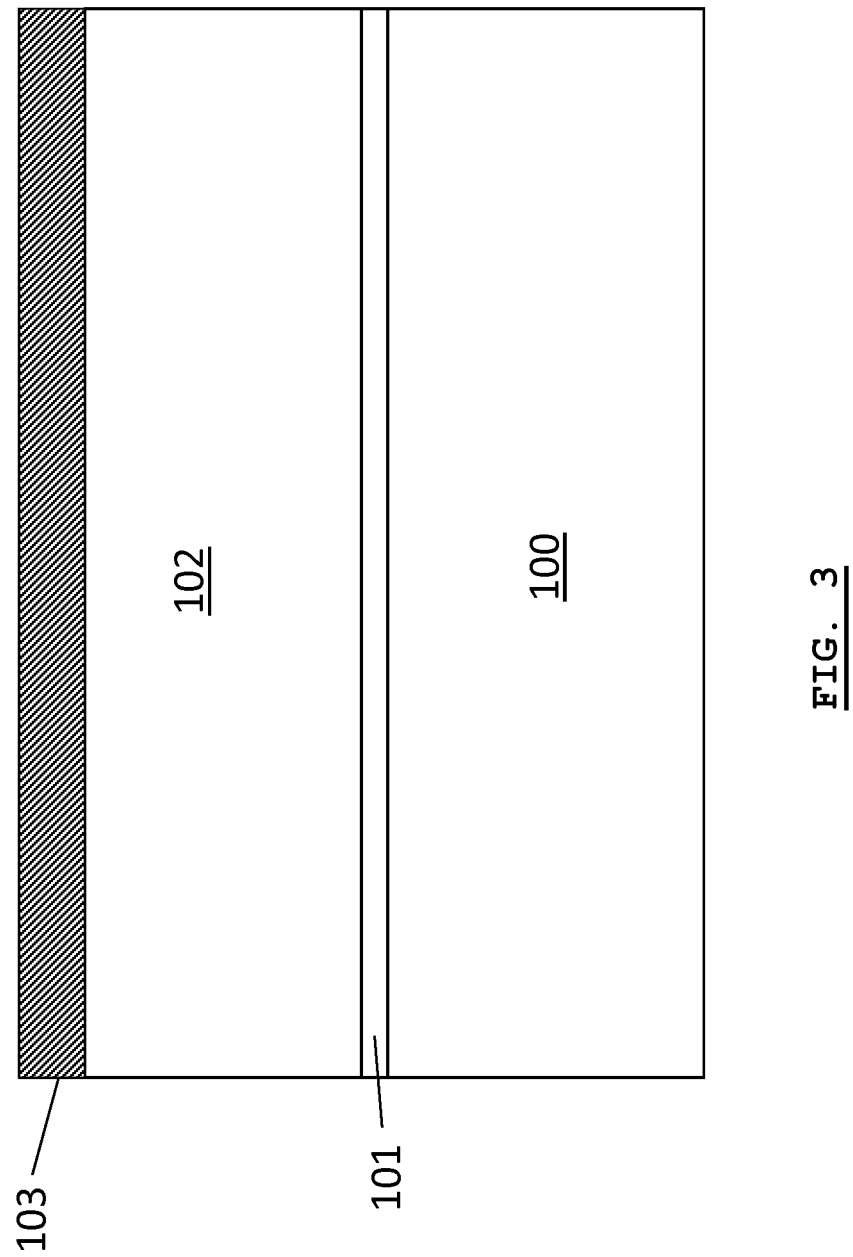

In the embodiment shown, a hardmask layer 103 is provided on top of the semiconductor substrate 1000, as shown in FIG. 3. The hardmask layer 103 may, for example, be a nitride layer, an oxide layer, or a combination thereof.

Figure 4:
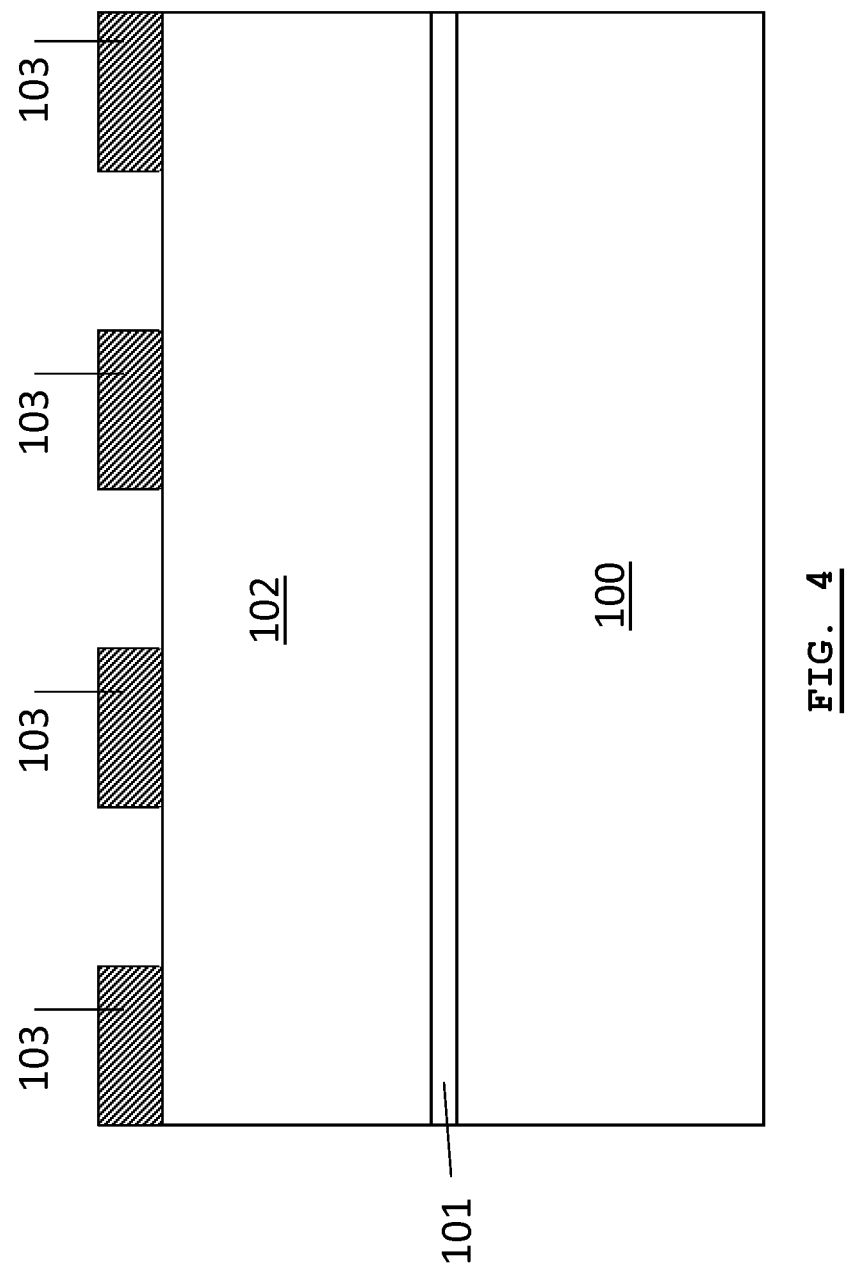

Next the hardmask layer 103 is patterned, as shown in FIG. 4. Using lithographic techniques, a photoresist material (not shown) may be applied on top of the hardmask layer 103, exposed, developed and etched. Next the underlying hardmask layer 103 may be etched using the patterned photoresist material as a mask. As a result the hardmask layer 103 is patterned, such that openings are etched in the hardmask layer, thereby exposing the underlying semiconductor substrate 1000.

Figure 5:
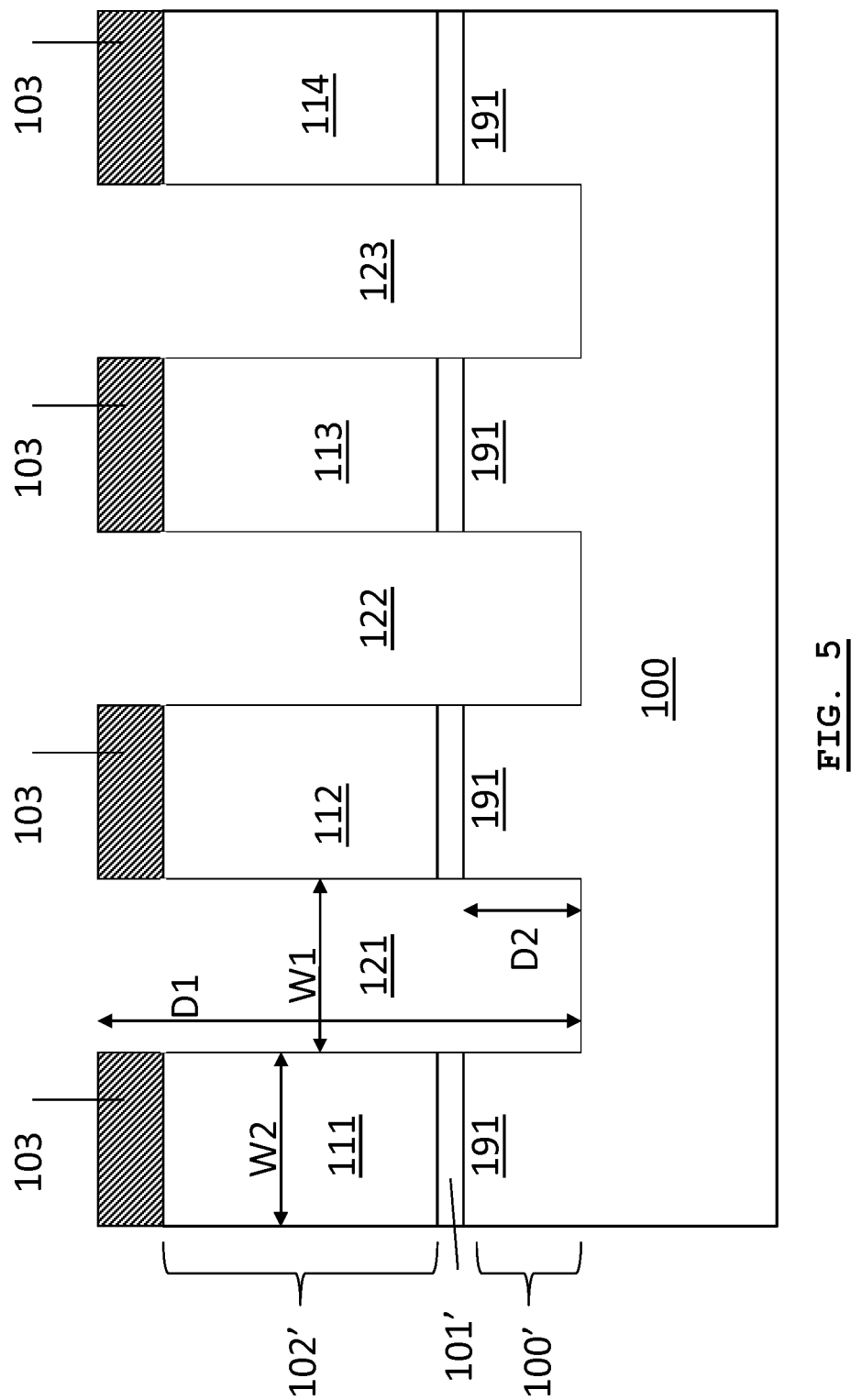

Using the patterned hardmask layer 103 as a mask, the underlying semiconductor substrate 1000 may be etched as shown in FIG. 5, thereby forming the at least two trenches 121, 122, 123 in the semiconductor substrate 1000 as well as a number of elevated structures 111, 112, 113, 114 are formed in the semiconductor substrate. The elevated structures 111-114 may also be referred to as fins or pillars.

Figure 6:
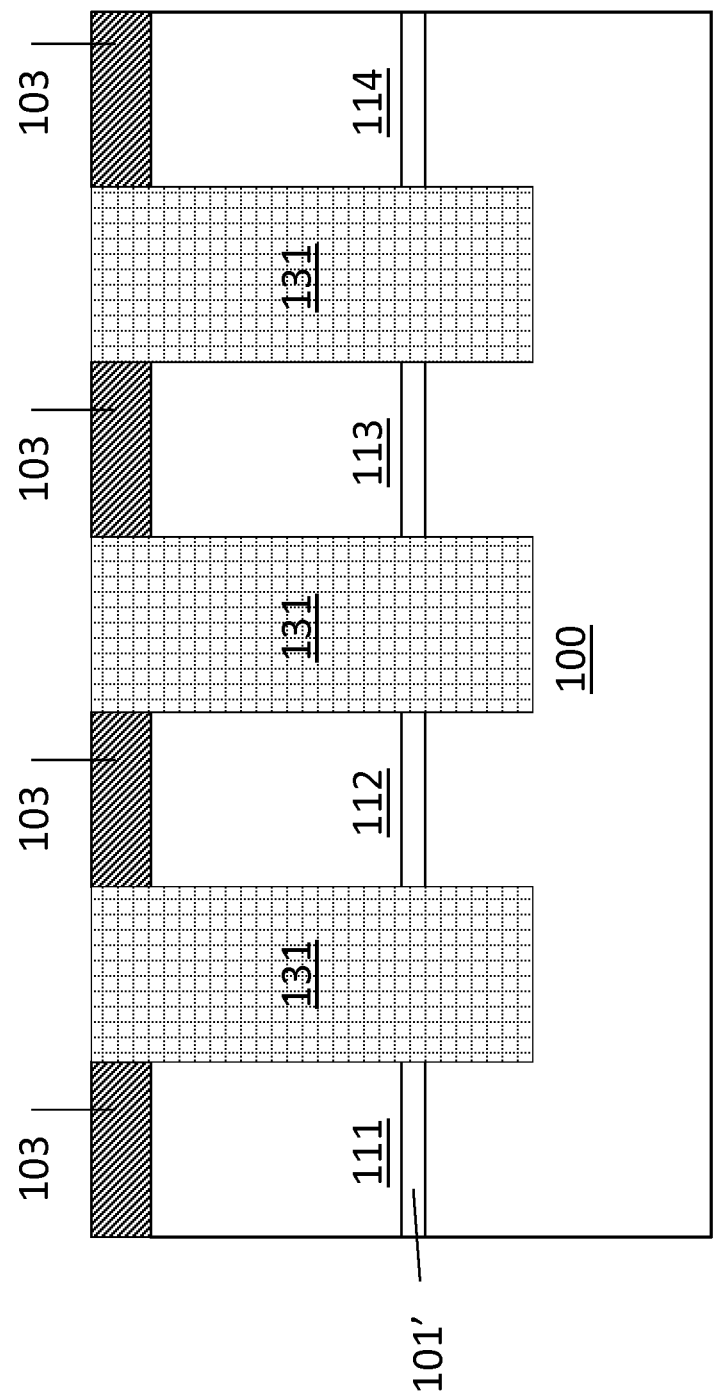

The at least two trenches 121, 122, 123 may then be completely filled with an insulating material 131, as shown in FIG. 6, followed by a chemical-mechanical planarization step (CMP) to remove the excess insulating material on top of the hardmask layer.

Figure 7:
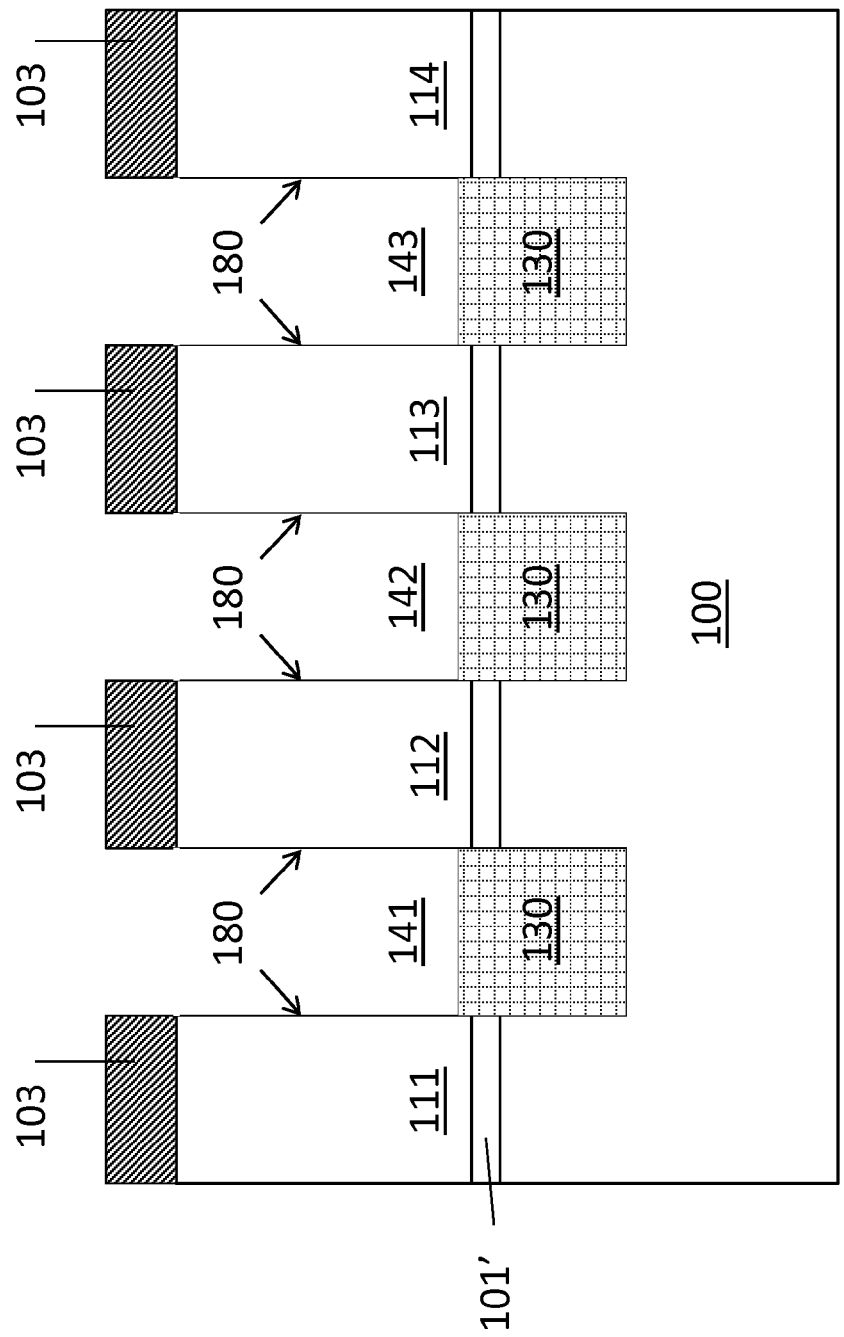

Next, part of the insulating material 131 in the trenches is etched such that openings 141, 142, 143 remain in between the elevated structures 111, 112, 113, 114, as shown in FIG. 7. Etching the insulating material 131 may be done for example by dry or wet etching techniques. The insulating material 131 may comprise or consist of silicon oxide or any material known for a person skilled in the art for providing STI regions. As a result of the etching, shallow trench isolation (STI) regions 130 in between the elevated structures 111-114 may be formed, and the elevated structures 111-114 may be electrically isolated from one another. In order to ensure a good electrical isolation between the fins, the shallow trench isolation regions 130 may be fairly deep, such as, for example, about 300 nm deep. The shallow trench isolation regions 130 may extend slightly, e.g., in the range of 5 to 20 nm above the tunnel dielectric portions 101' in order to avoid leakage from the floating gate channel layer 191 in the control gate layer 171, as further described below in connection with FIG. 9. Each of the isolation regions 130 is thus laterally in contact with the side wall of the base portions 100' and of the dielectric portions 101', and with (part of) the gate dielectric layer 160 of the elevated structures on either side of the trench in which the isolation region 130 is located.

Figure 8:
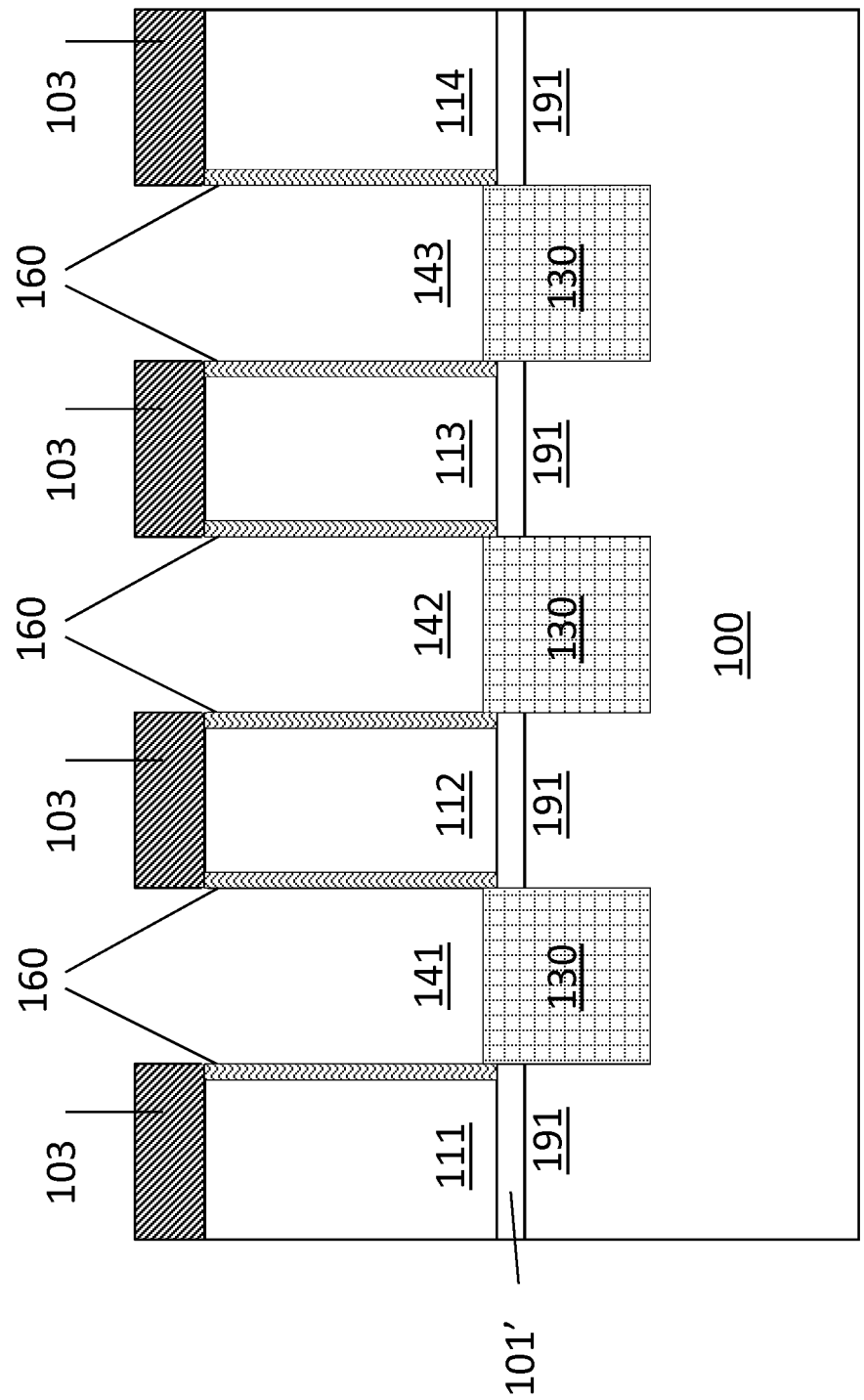

After the formation of the shallow trench isolation regions 130, a gate dielectric layer 160 is provided on all the sidewall surfaces 180 of the elevated structures 111, 112, 113, 114, as shown in FIG. 8. If the hardmask is not present any more, or if the trenches 121-123 are formed by a technique that does not involve a hardmask, the gate dielectric layer 160 may also be provided at the top surface of the elevated structures 111, 112, 113, 114.

In some embodiments, the gate dielectric layer 160 at the sidewall surface 180 and optionally at the top surface of the elevated structures 111, 112, 113, 114 is formed by a thermal oxidation of the semiconducting material of the elevated structures 111, 112, 113, 114. The thermal oxidation may for example be performed by an in-situ steam generation (ISSG) oxidation step.

By using a monocrystalline semiconductor material (e.g., monocrystalline silicon) for the top portions 102' of the elevated structures (i.e., the floating gates), the quality and scalability of the gate dielectric layer 160 can be improved significantly as this gives the opportunity to use thermal oxide grown on the monocrystalline floating gate.

Such thermally grown oxide layers are thinner than the traditionally deposited ONO stacks on polycrystalline floating gates. The disclosed method is applicable on a monocrystalline layer 102, hence resulting in monocrystalline floating gate structures 102', hence providing the advantage of being able to produce thin lateral isolation layers ('lateral' meaning at the sidewalls of the fins), preferably having a thickness between 6 nm and 8 nm. The method of the invention therefore allows scaling down memory devices to the 1× generation node.

As shown in FIG. 8, the thermal oxidation leads to the formation of the gate dielectric layer 160 in such a way that the gate dielectric layer 160 overlaps with the isolation regions 130. In the embodiment shown, this overlap extends down to the top surface of the dielectric portion 101'. However this overlap may extend over a smaller distance so that the gate dielectric layer 160 does not extend down to the top surface of the dielectric portion 101', but extends to a height between said top surface and the top surface of the isolation region 130.

Figure 9:
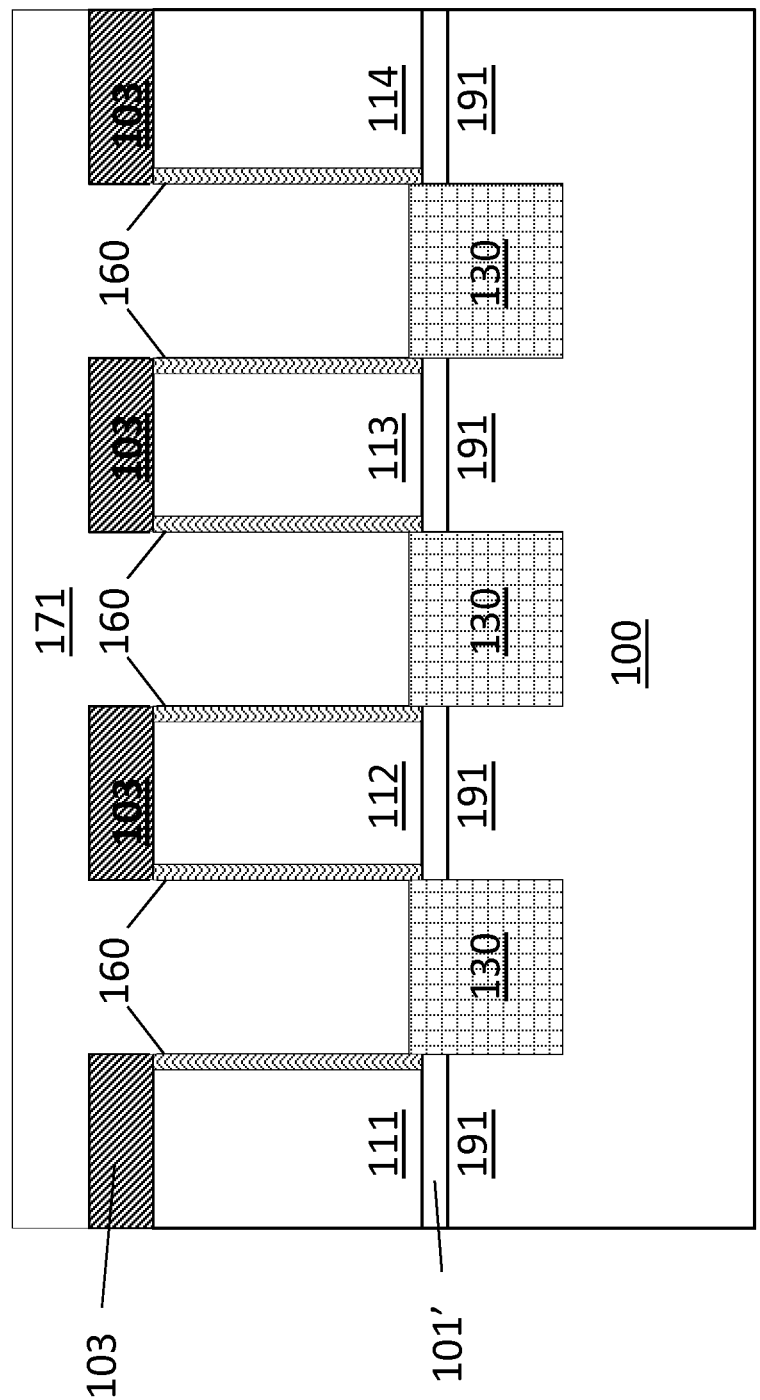

After the formation of the gate dielectric 160, a conductive layer 171 is provided over and/or on the elevated structures 111, 112, 113, 114 and the gate dielectric layer 160, as shown in FIG. 9. The cavities 141, 142, 143 in between the elevated structures 111, 112, 113, 114 are filled with said conductive material 171. The conductive material 171 is also provided on top of the fins. Further steps may then be done as known for a person skilled in the art such as for example source and drain (s/d) formation and implantation or doping of the fins.

As such a floating gate semiconductor device is formed wherein part of the dielectric layer 101 is acting as the tunnel dielectric layer, part of the semiconductor layer 111, 112, 113, 114 is acting as the floating gate(s), the gate dielectric layer 160 is acting as the interpoly dielectric layer of prior art devices, and the conductive layer is acting as the control gate 171.

According to an alternative embodiment, forming the at least two trenches 141-143 is done in two etching steps. In a first etching step, first trenches 181, 182, 183 are etched, as shown in FIG. 10, thereby exposing the dielectric layer 101.

In between the first and the second etching step, dopant atoms 190 may be implanted into the substrate 100 and diffused under the elevated structures 111, 112, 113, 114, as shown in FIG. 11. In this way, channel regions 191 in the substrate are formed under the elevated structures, e.g. by a thermal anneal. When the doping method is perpendicular to the substrate surface (in other words perpendicular to the top surface of the elevated structures) and the top surface of the elevated structures is covered with a hard mask layer 103, the elevated structures will not be doped during this doping step or at least will only receive a very small (e.g., negligible) amount of dopants. Other methods of doping the channel region in the substrate could also be foreseen as known by a person skilled in the art.

In a second etching step the final trenches 121, 122, 123 are formed, as shown in FIG. 5 and described above, by etching part of the dielectric layer 101 in between the elevated structures already formed and by etching part of the semiconductor substrate 100 further on.

When the trenches 121-123 shown in FIG. 5 are formed in one etching step, as described above, the method may comprise a step of implanting dopant elements by implanting said elements through the side walls of the elevated structures 111-114, again to form channel regions 191 underneath the dielectric portions 101'.

The elevated structures 111-114 may also be formed for example by using spacer-defined patterning.

As shown, each elevated structure comprises or consists of a semiconductor top portion 102' (part of the semiconductor top layer 102) on and in contact with an dielectric portion 101' (part of the dielectric layer 101) on and in contact with a semiconductor base portion 100' (part of the semiconductor base layer 100), as shown in FIG. 11. The semiconductor top portion 102' of the elevated structures will serve as the floating gate of the semiconductor memory device. The dielectric portion 101' of the elevated structures will act as the tunnel dielectric layer of the semiconductor memory device.

The top of floating gate regions 102' may optionally be rounded, thereby forming rounded corners with a predetermined radius, for example, with a radius of about 2 nm, or 4 nm. Corner rounding of the floating gate regions will avoid excessive current leakage. The thermal oxidation to form the gate dielectric 160 may itself cause a degree of corner rounding, e.g. up to a radius of about 2 nm, at the top corners of the fins, whether or not the hardmask 103 is still present at the top of the fins. To obtain rounded corners with a radius higher than 2 nm, it is possible to apply a suitable process before the formation of the gate dielectric 160, as described, for example, in European Patent Publication No. EP2073256.

Depending on the applications and technology node for which the resulting semiconductor devices will be used, the dimensions of the elevated structures may differ. In an example embodiment, e.g., for floating gate memory device applications, the width W1 of the trenches, as shown in FIG. 5, may be in the range of 14 nm to 25 nm, the width W2 of the elevated structures may be in the range of 3 nm to 30 nm, the depth D1 of the trenches may be in the range of 230 nm to 370 nm, and the depth D2 of the part of the trenches underneath the dielectric layer 101 may be in the range of 200 nm to 300 nm.

The elevated structures 111, 112, 113, 114 are formed of a monocrystalline semiconductor material, such as monocrystalline Si.

Either the entire hardmask layer 103 or a part of it may remain present during the whole manufacturing flow of the floating gate semiconductor device. The presence of the hardmask layer 103 may prevent excessive leakage at the corners of the cell (elevated structure). Alternatively, the hardmask layer may be removed after the step of providing the trenches, and thus the elevated structures.

For purposes of illustration, an number of example experimental results for an example monocrystalline floating gate device are described below. It is to be understood, however, that the example experimental results are merely illustrative and are not meant to be limiting.

In the example experiment, a cell structure with monocrystalline floating gates and 6 nm to 8 nm of thermally grown $SiO_2$ gate dielectric is provided. This thin gate dielectric avoids the physical scaling barrier caused by the ONO thickness limitation. Simulations show that, down to the 12 nm node, such cells can be programmed without excessive gate dielectric leakage. The combination of modeling and experimental data indicates that 12 nm memory cells with 8 nm $SiO_2$ gate dielectric achieve 10 years of data retention. Simulations predict further scaling potential towards 6 nm gate dielectric in the 10 nm node.

Figure 12B:
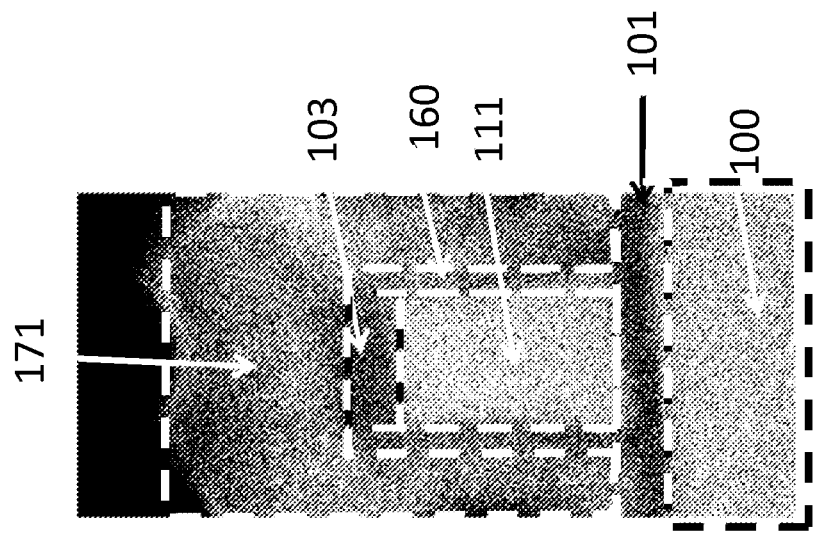
FIGS. 12A (schematic structure) and 12B (microscopic image) illustrate an example floating gate semiconductor device, in accordance with some embodiments.
Figure 12A:
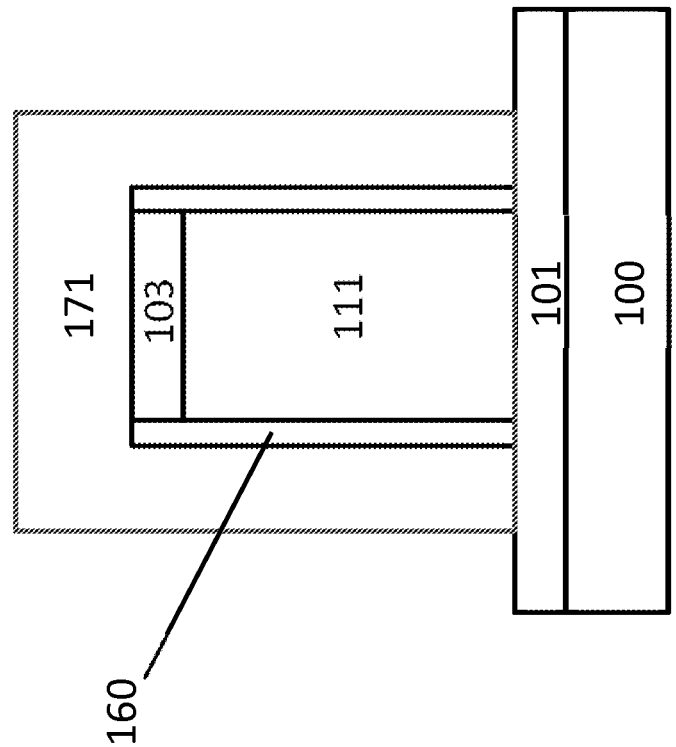

A cross-section of the proposed cell structure is shown in FIGS. 12A and 12B. FIG. 12A is a schematic representation of the semiconductor floating gate device, while FIG. 12B shows a microscopy image of the semiconductor floating gate device. A SOI substrate (100-101-111) is shown with a silicon (semiconductor base) layer 100, on which a tunnel oxide layer 101 (SOI buried oxide layer) with a thickness of about 10 nm is formed. In the semiconductor layer a floating gate region 111 is formed. The floating gate region is a monocrystalline floating gate region with a thickness/height of about 75 nm and width of about 55 nm. On the floating gate region 111 a $SiO_2$ hardmask 103 is provided (before patterning the floating gate regions). The $SiO_2$ hardmask 103 serves to avoid leakage at the top of the floating gate 111. The floating gate corners at the top may be rounded in order to avoid leakage, for example with a radius of 4 nm. The sidewalls of the monocrystalline floating gate region 111 have undergone a thermal oxidation step (more specifically an in-situ steam generation (ISSG) oxidation step) in order to form the $SiO_2$ gate dielectric layer with a width of about 6 to 8 nm wide. Thereafter a polysilicon control gate 171 with a thickness of about 25 nm is formed (by deposition and patterning) upon the floating gate/gate dielectric structure.

In order to estimate programming performance and cell-to-cell interference, simulations of cell coupling in a dense array are performed using Raphael RC3. Programming and gate dielectric leakage are obtained using the nonlocal tunneling model in Sentaurus device on single memory cells in combination with the coupling ratios as obtained from RC3. Programming saturation is defined as the threshold voltage ($V_{th}$) shift for which the gate dielectric leakage is equal to the tunnel oxide current with a floating gate voltage $V_{FG}$=8.5 V. Data retention is investigated both by using a percolation model and by measurements on dedicated floating gate test structures.

Figure 13:
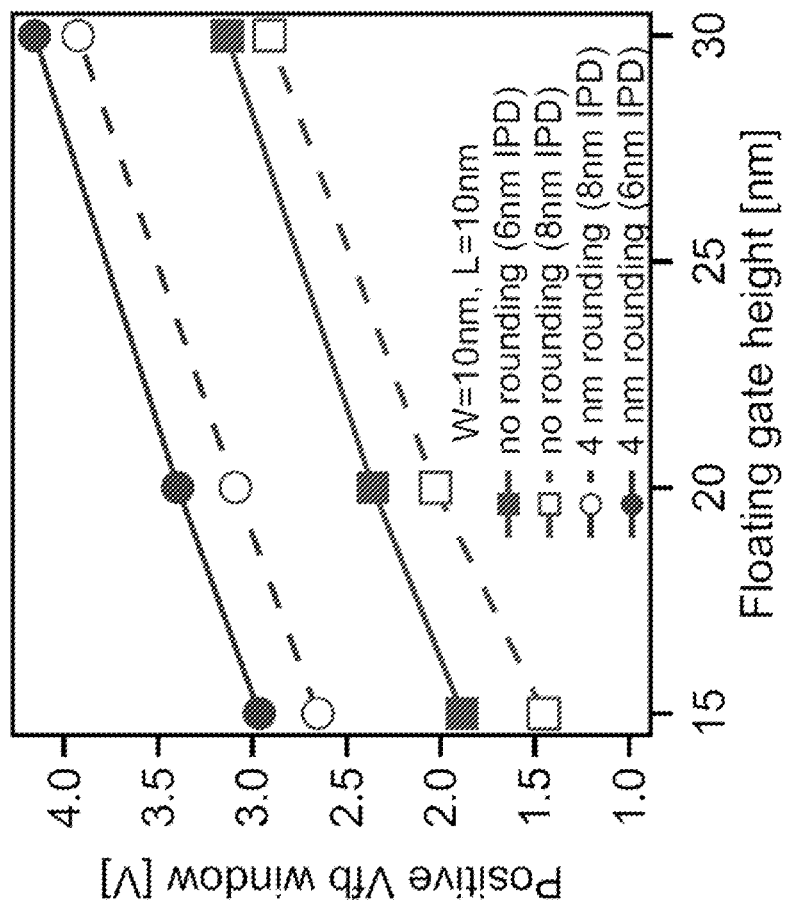
FIG. 13 shows simulation results of a positive $V_{FB}$ shift with and without corner rounding of the floating gate region manufactured, in accordance with some embodiments.

FIG. 13 shows simulation results of a positive $V_{FB}$ shift with and without corner rounding of the floating gate region manufactured, in accordance with some embodiments. As shown in FIG. 13, both the height and corner rounding of the floating gate region strongly impacts programming saturation for a single cell. As noted above, the thermal oxidation to form the gate dielectric will normally cause a limited corner rounding, so the case without corner rounding is primarily to be regarded as theoretical. FIG. 13 shows simulation results for a floating gate device (as shown in FIG. 12) of the positive flatband voltage $V_{FB}$ window as a function of the height of the floating gate with and without corner rounding for a gate dielectric layer of 6 nm or 8 nm. A difference of about 1.5V is seen between the results with or without corner rounding which proves the advantages of having corner rounded floating gate regions. However, the gate dielectric thickness is not critical towards programming performance within the studied range of 6 nm to 8 nm.

Figure 14:
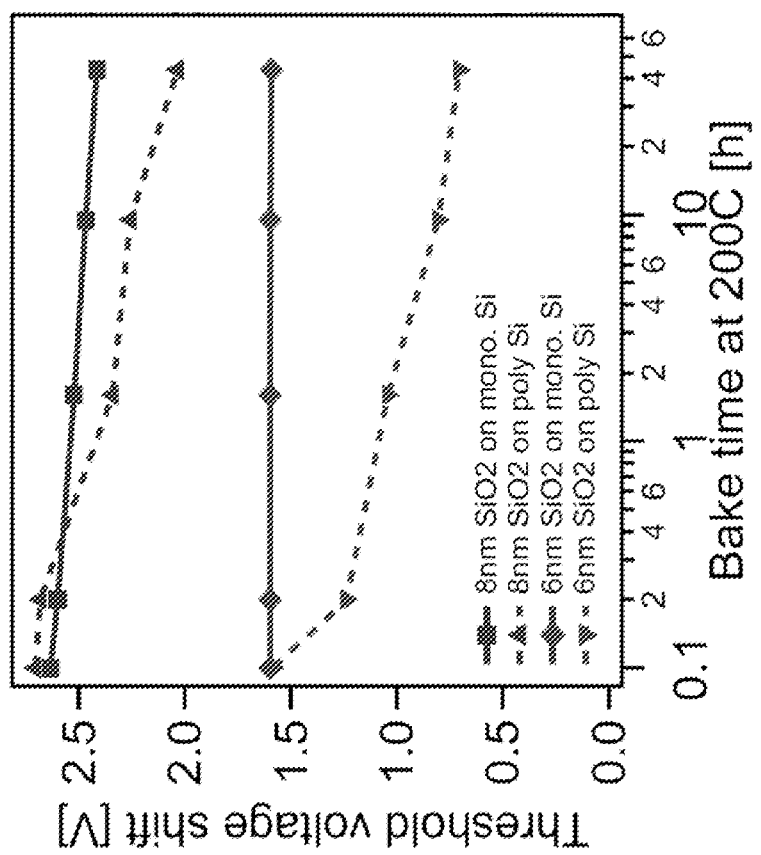
FIG. 14 illustrates experimental results of high-temperature data retention after 10 years for a floating gate semiconductor device, in accordance with some embodiments.

Also high-temperature data retention has been measured on dedicated test structures (e.g., as shown in FIG. 12B) comprising a large number of monocrystalline floating gate stripes, which are elongate floating gate test structures. FIG. 14 illustrates experimental results of high-temperature data retention after 10 years for a floating gate semiconductor device, in accordance with some embodiments.

It can clearly be seen in FIG. 14 that the quality of the thin $SiO_2$ hardmask (capping) layer grown on the floating gate is very good, resulting in a small threshold voltage ($V_{th}$) after a bake of more than 40 hours at a temperature of 200 degrees Celsius. Fill lines show the results for a monocrystalline floating gate, whereas dashed lines show the results for a polycrystalline floating gate. Results for 6 nm gate dielectric and 8 nm gate dielectric are shown.

It is an advantage of embodiments of certain inventive aspects that a monocrystalline floating gate structure with aggressively scaled thermal $SiO_2$ gate dielectric for ultimate floating gate NAND cell scaling may be provided. With this structure, NAND Flash can be scaled at least down to 12 nm without major roadblocks (e.g., geometric scaling, parasitic interference, floating gate charge). Simulations and experimental results on test structures demonstrate that the aggressively scaled gate dielectric required for this still allows for obtaining 10 years of data retention taking a small fraction of failing cells in account, still correctable by an Error Checking and Correction (ECC) algorithm.

The invention claimed is:

1. A method comprising:
providing a semiconductor-on-insulator substrate comprising:
a semiconductor base layer,
a dielectric layer on and in contact with the semiconductor base layer, and
a monocrystalline semiconductor top layer on and in contact with the dielectric layer;
forming at least two trenches in the semiconductor-on-insulator substrate, wherein the at least two trenches extend through the top layer and the dielectric layer and extend partially through the base layer;
as a result of forming the at least two trenches, forming at least one elevated structure comprising:
a base portion comprising a portion of the base layer,
a dielectric portion comprising a portion of the dielectric layer, wherein the dielectric portion is on and in contact with the base portion, and
a top portion comprising a portion of the top layer, wherein the top portion is on and in contact with the dielectric portion;
forming isolation regions at a bottom of the at least two trenches, wherein forming the isolation regions comprises partially filling the at least two trenches;
thermally oxidizing exposed sidewall surfaces of at least the top portion, thereby providing a gate dielectric layer on at least the exposed sidewall surfaces; and
forming a conductive layer over the at least one elevated structure, the gate dielectric layer, and the isolation regions to form at least one floating gate semiconductor memory device.

2. The method of claim 1, wherein the dielectric portion comprises a tunnel dielectric layer, the top portion comprises a floating gate, and the conductive layer comprises a control gate.

3. The method of claim 1, wherein partially filling the at least two trenches comprises:
filling the at least two trenches with an insulating material; and
partially removing the insulating material from the at least two trenches, leaving insulating material at the bottom of the at least two trenches, thereby forming the isolation regions.

4. The method of claim 1, wherein the dielectric layer has an equivalent oxide thickness between about 6 nm and about 10 nm.

5. The method of claim 1, further comprising thermally oxidizing a top surface of the at least one elevated structure, thereby providing the gate dielectric on the top surface of the at least one elevated structure.

6. The method of claim 1, wherein:
the isolation regions are in contact with the base portion and the dielectric portion of the at least one elevated structure, and with a portion of the gate dielectric layer; and
the isolation regions extend above the dielectric portion.

7. The method of claim 1, wherein forming the at least two trenches comprises:
forming a patterned hardmask layer on the semiconductor-on-insulator substrate; and
etching the at least two trenches in areas of the semiconductor-on-insulator substrate that are not patterned with the patterned hardmask layer.

8. The method of claim 7, wherein:
after the at least two trenches are formed, the patterned hardmask layer remains on a top surface of the at least one elevated structure; and
forming the conductive layer over the at least one elevated structure comprises forming the conductive layer over the patterned hardmask layer that remains on the top surface of the at least one elevated structure.

9. The method of claim 7, further comprising:
after forming the at least two trenches, removing the patterned hardmask layer; and
after removing the patterned hardmask layer and before thermally oxidizing the exposed sidewall surfaces of the top portion, rounding top corners of the at least one elevated structure.

10. The method of claim 1, wherein forming the at least two trenches comprises:
- in a first etch, etching through the top layer to expose the dielectric layer, thereby forming at least two partial trenches; and
- in a second etch, etching through the dielectric layer and partially through the base layer, thereby converting the at least two partial trenches to the at least two trenches.

11. The method of claim 10, further comprising:
- after the first etch and before the second etch, injecting dopant elements into the at least two partial trenches.

12. The method of claim 1, wherein the gate dielectric layer has a thickness between about 6 nm and about 8 nm.

* * * * *